(12) United States Patent
Sung

(10) Patent No.: US 6,686,609 B1
(45) Date of Patent: Feb. 3, 2004

(54) PACKAGE STRUCTURE OF SURFACE MOUNTING LED AND METHOD OF MANUFACTURING THE SAME

(75) Inventor: Wen-Kung Sung, Taipei Hsien (TW)

(73) Assignee: Ultrastar Limited, Tortola (VG)

( * ) Notice: Subject to any disclaimer, the term of this patent is extended or adjusted under 35 U.S.C. 154(b) by 0 days.

(21) Appl. No.: 10/260,433

(22) Filed: Oct. 1, 2002

(51) Int. Cl.$^7$ ................................................ H01L 33/00
(52) U.S. Cl. ..................... 257/100; 257/99; 257/433; 257/679; 257/684; 257/687; 257/788
(58) Field of Search ..................... 257/100, 99, 433, 257/687, 684, 788, 789, 679

(56) References Cited

U.S. PATENT DOCUMENTS

| | | | |
|---|---|---|---|
| 5,298,768 A | * 3/1994 | Okazaki et al. | 257/81 |
| 5,814,837 A | * 9/1998 | Okazaki | 257/91 |
| 5,907,162 A | * 5/1999 | Maruyama | 257/98 |
| 6,573,580 B2 | * 6/2003 | Arndt | 257/433 |

FOREIGN PATENT DOCUMENTS

JP  04102378 A  * 4/1992

* cited by examiner

Primary Examiner—Nathan J. Flynn
Assistant Examiner—Remmon R. Fordé
(74) Attorney, Agent, or Firm—Birch, Stewart, Kolasch & Birch, LLP

(57) ABSTRACT

This specification discloses a package structure of surface mounting light emitting diodes (LEDs) and the method of manufacturing the same. The package of the surface mounting LEDs is achieved by providing a substrate having a cavity and a plurality of pads. The plurality of pads are isolated from each other. The cavity is formed from the upper surface of the substrate downward to the bottom so that the LED chips are wholly inlaid in the cavity. Bonding wires couple the LED chips and the plurality of pads. A cope is filled in the cavity and covers the surface of the substrate for protecting the LED chips sand the bonding wire. In comparison with prior arts, the thickness of the structure disclosed in the invention is reduced by inlaying the LED chips in the cavity. Furthermore, the light emits from multiple surface of the LED.

9 Claims, 4 Drawing Sheets

PACKAGE STRUCTURE OF SURFACE MOUNTING LED AND METHOD OF MANUFACTURING THE SAME

BACKGROUND OF THE INVENTION

1. Field of Invention

The present invention relates to a package structure of surface mounting light emitting diodes (LEDs) and the method of manufacturing the same and, in particular, to a thinner package structure of surface mounting light emitting diodes (LEDs) and the method of manufacturing the same.

2. Related Art

Due to the fast progress in electronics technology, both electronic devices and their relevant products are becoming lighter, thinner, shorter, and smaller. Aside from minimizing the electronic elements, the surface mounting technology is widely used. A printed circuit board (PCB) is often used as the substrate of a surface mounting LED. A prior art as shown in FIG. 1, an LED chip 10 is mounted on a printed circuit board 30, and a bonding wire 20 couples the LED chip 10 and the PCB 30.

The whole structure is encapsulated by epoxy 40 in order to protect the LED chip 10 and the bonding wire 20. The PCB 30 is conducted to some other components through a hole 31. The structure is thicker since it includes at least three layers of the LED chip 10, the bonding wire 20 and the PCB 30. Therefore, under the trend of lighter, thinner, shorter, and smaller products, the manufacturing method using a PCB as the substrate of an LED chip can not fulfill the requirement.

There is another prior art using a lead frame as the substrate to support the LED chip. The package structure is composed of a lead frame 20. It is done supporting a chip 30 and providing wires for electrical connection to external devices. As shown in FIG. 2, the LED chip 10 is mounted on the lead frame 32, through which the chip 10 is conductible to the other components. The LED chip 10 is coupled to the pin 33 of the lead frame 32. The whole structure is also encapsulated by epoxy 40. The problem is the same as the one described above. The structure mentioned above is thicker because the LED chip 10 is mounted on the surface of the PCB or the lead frame.

Therefore what is needed is a less thick package structure that meets the trend of lighter, thinner, shorter, and smaller products.

SUMMARY OF THE INVENTION

An object of the invention is to provide a thinner package structure and the method for manufacturing a surface mounting LED element. The LED chip is inlaid inside the PCB so as to reduce the thickness of the structure.

Another object of the invention is to provide a method for manufacturing a surface mounting LED element that makes it possible to emit from multiple surfaces of the structure. The LED chip and the bonding wires are inlaid in a cavity formed in the PCB so that the light is able to emit from multiple surfaces of the LED chip.

The invention provides a package structure of a surface mounting light emitting diode (LED) element and its manufacturing method. The structure includes a substrate having a cavity and a plurality of pads insulating from each other; at least one LED chip wholly inlaid in the cavity; a bonding wire for coupling the LED chips and the plurality of pads; a cope filled in the cavity and covering the top surface of the substrate for protecting the LED chips and the bonding wire.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

A light emitting diode (LED) functions like a small bulb. When applied with an electrical current, it emits light. In accompany with switches of many electronics, LED is used to indicate whether the power is turned on. For example, there usually are the "Turbo" indicator, power indicator, and hard drive indicator on a computer panel. They are all LEDs.

The LED has the advantages of a larger mechanical strength, a longer lifetime, a higher luminosity, a higher electro-optical conversion rate, and a lower starting voltage that are especially suitable for indicators. It gradually replaces the role played by tungsten bulbs. There are several LEDs reaching the practical stage, each of them has its own advantages and applications. In particular, a surface mounting LED is a kind of LED that can be directly adhered to a predetermined position on the surface of a printed circuit board (PCB) to form an electrical connection. However, as the electronic technology is fast progressing, the trend for a lighter, thinner, shorter, and smaller product becomes more significant. Since the thickness of the conventional PCB can not be reduced owing to the product specification, a thinner package structure of surface mounting LEDs and its manufacturing method becomes the object of this invention.

Figure 1:
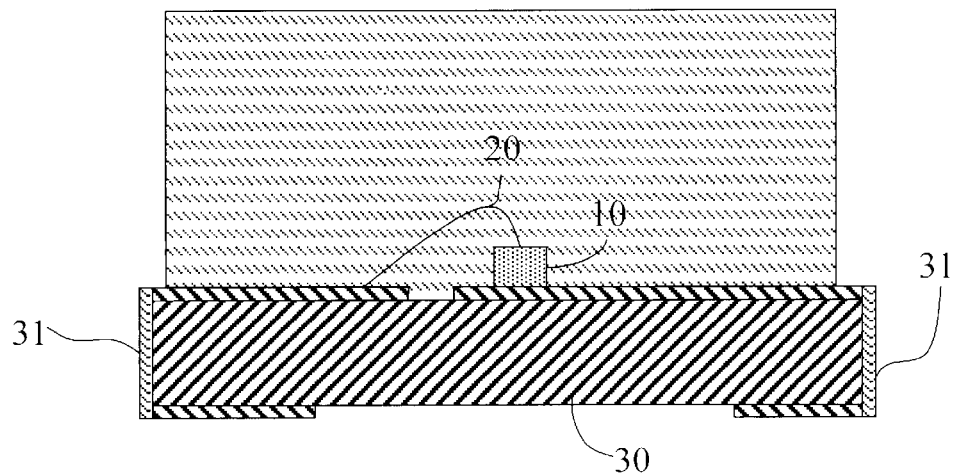
FIG. 1 is a side view of the package structure of a surface mounting LEDs using a conventional PCB as the surface mounting LED chip substrate.
Figure 2:
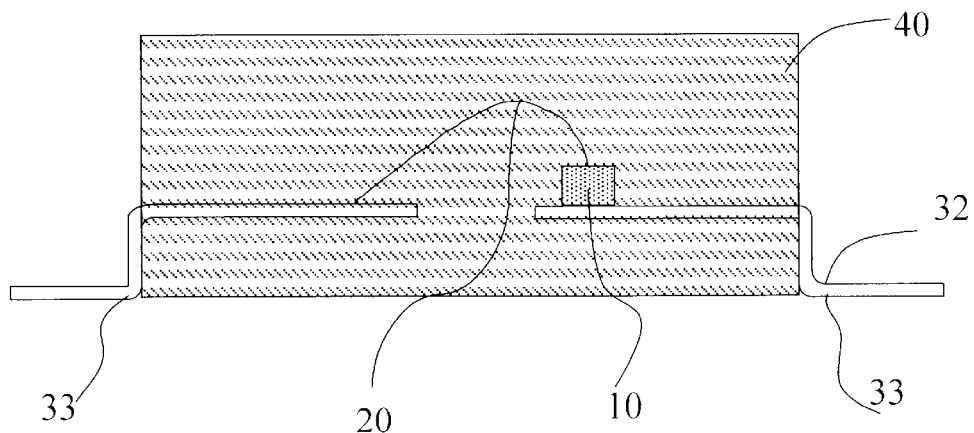
FIG. 2 is a side view of the package structure of a surface mounting LEDs using a conventional lead frame as the surface mounting LED chip substrate.
Figure 3:
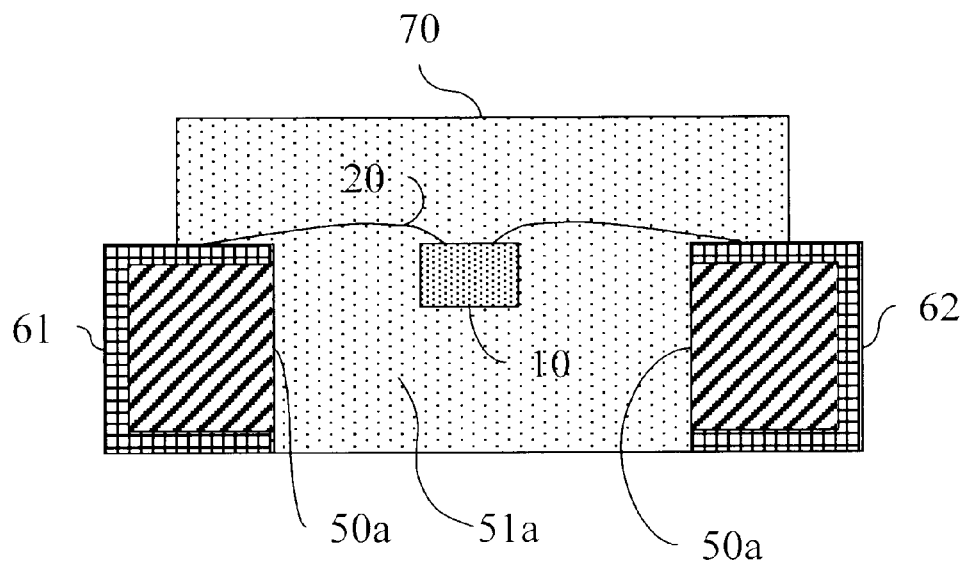
FIG. 3 is a side view of a first embodiment of the invention using a substrate having a cavity as the surface mounting LED chip substrate.

FIG. 3 is a side view of the first embodiment of the invention. The package structure of a surface mounting LED uses a substrate having a cavity as the LED chip substrate, The structure makes the surface mounting LED emitting light upward and downward. According to the first embodiment of the invention, the structure comprises a substrate 50a, which is metal or non-metal. The upper and lower layers of the substrate 50a are coated with a conductive material (not shown in the figure) so that a bonding wire 20 and an LED chip 10 can be firmly fixed. Usually the conductive material can be gold, silver, tin, chromium, nickel or an alloy from parts of them. However, gold is less adopted because of its high price and worse reflection property. The substrate 50a contains a cavity 51a, which is formed from the surface of the substrate 50a downward to the bottom. The LED chip is inlaid into the cavity 51a. The outside of the substrate 50a is cohered with a first pad 61 and a second pad 62. The first pad 61 and the second pad 62 are insulating from each other. A bonding wire 20 couples the LED chip 10, the first pad 61 and the second pad 62. A cope 70 is filled in the cavity 51a and covers the LED chip 10 and the bonding wire 20 for protecting the LED chip 10 and the bonding wire 20. The cope 70 can be manufactured by low pressure molding technology or encapsulation technology, at last dicing the package structure of LEDs to finish the structure.

Figure 4:
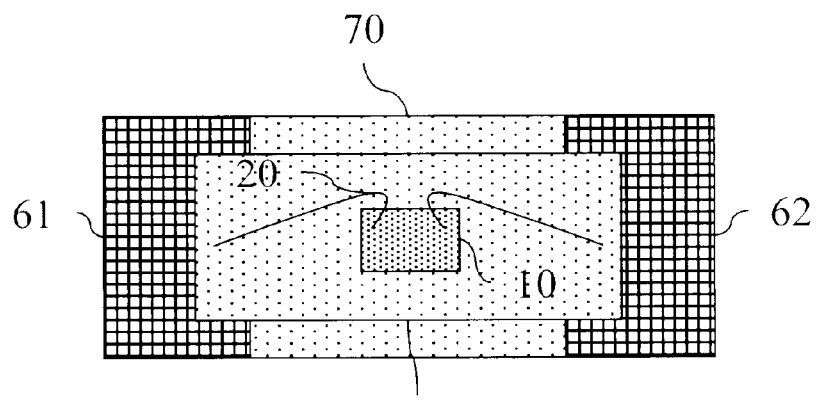
FIG. 4 is a top view of the first embodiment of the invention using a substrate having a cavity as the surface mounting LED chip substrate.

FIG. 4 is a top view of the first embodiment of the invention using a substrate having a cavity as the LED chip substrate. The light emits from the LED chip 10. The shape of the cope 70 could be cuboid, round or any other shape that covers the LED chip 10 and the bonding wires 20. FIG. 3 and FIG. 4 illustrate the first embodiment of the present invention. In comparison with prior arts, the thickness of the structure disclosed in the invention is reduced by inlaying the LED chip 10 in the cavity 51a formed inside the substrate 50a.

Figure 5:
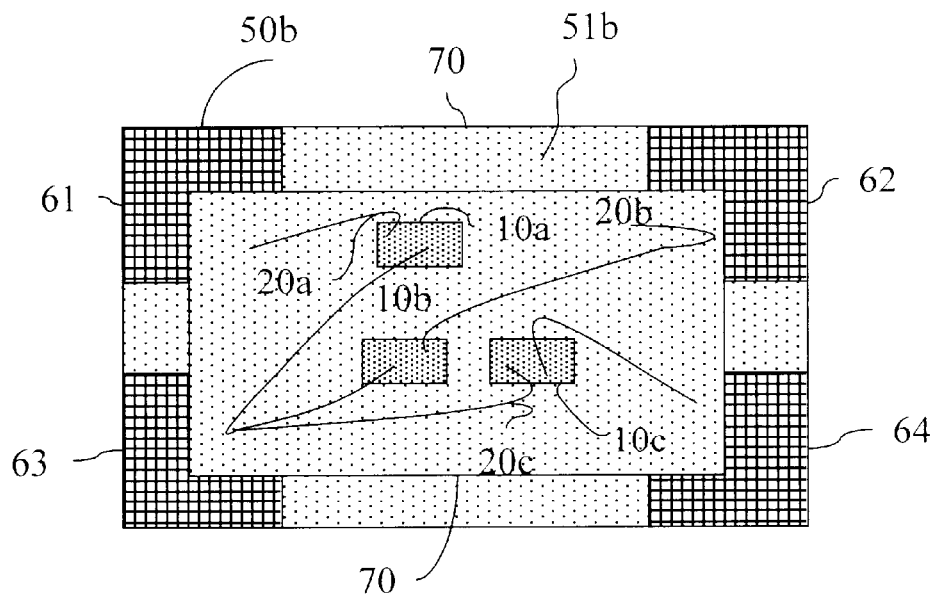
FIG. 5 is a top view of a second embodiment of the invention using a substrate having a plurality of surface mounting LEDs inlaid in a cavity.

FIG. 5 is a top view of the second embodiment of the invention. The package structure of surface mounting LEDs uses a substrate inlaying a plurality of LED chips. According to the second embodiment of the invention, the structure comprises a substrate 50b, which is metal or non-metal. The metal substrate is a conductive layer, which is iron or copper. The upper and lower layers of the substrate 50b are applied with a conductive material (not shown in the figure) so that a bonding wire 20 and an LED chip 10 can be firmly fixed. Usually the conductive material can be gold, silver, tin, chromium, nickel or an alloy from a part of them. However, gold is less adopted because of its high price and worse reflection property. The substrate 50b contains a cavity 51b, which is formed from the surface downward to the bottom. There are three LED chips 10a, 10b and 10c inlaid in the cavity 51b. The outside of the substrate 50b is coated with a first pad 61, a second pad 62, a third pad 63 and a fourth pad 64. The first pad 61, the second pad 62, the third pad 63 and the fourth pad 64 are not conductive to each other. A bonding wire 20a couples the LED chip 10a and the first pad 61. A bonding wire 20b couples the LED chip 10b and the second pad 62. A bonding wire 64 couples the LED chip 10c and the fourth pad 64. The LED chip 10a, 10b and 10c are also coupled to the third pad 63 by bonding wires 20a, 20b and 20c respectively. A cope 70 is filled in the cavity 51 a and covers the LED chip 10a, 10b and 10c and the bonding wires 20a, 20b and 20c for protecting the LED chip 10a, 10b and 10c and the bonding wires 20a, 20b and 20c. The cope 70 can be manufactured by low pressure molding technology or encapsulation technology, at last dicing the package structure of LEDs to finish the structure.

Figure 6:
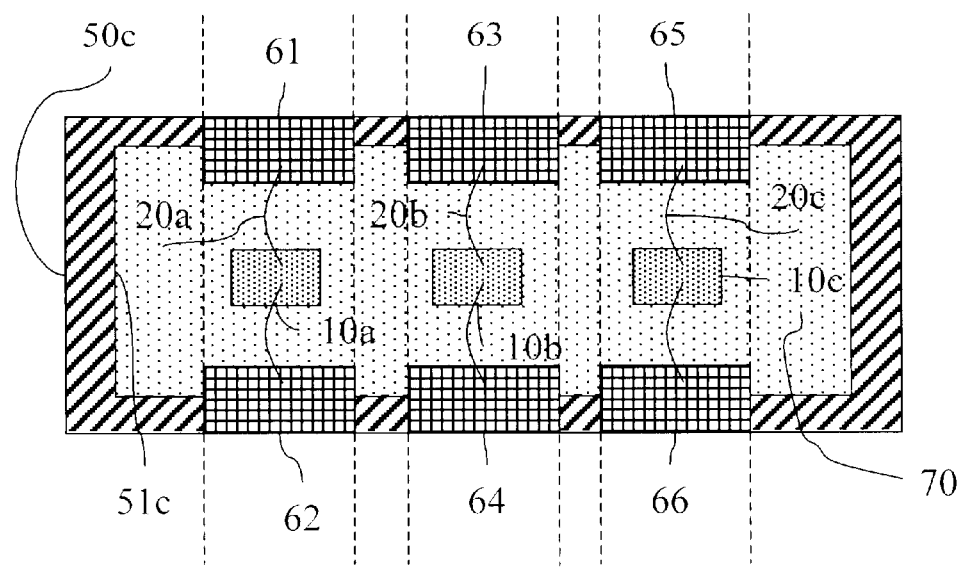
FIG. 6 is a top view of a third embodiment of the invention using a cuboid substrate having a cavity as the surface mounting LED chip substrate.
Figure 7:
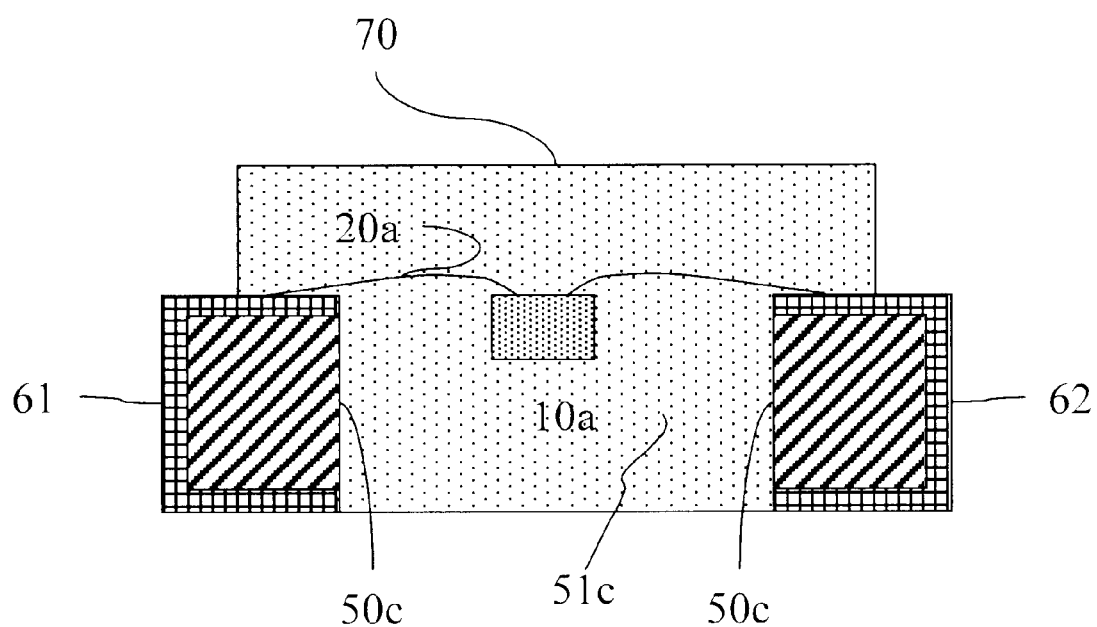
FIG.7 a side view of the third embodiment of the invention using a cuboid substrate having a cavity as the surface mounting LED chip substrate.

FIG. 6 is a top view of a third embodiment of the invention. The package structure of a surface mounting LED uses a cuboid substrate having a cavity as the LED chip substrate. The structure makes the surface mounting LED emitting light from multiple surfaces of the substrate. According to the third embodiment of the invention, the structure comprises a substrate 50c, which is metal or non-metal. The upper and lower layers of the substrate 50c are applied with a conductive material (not shown in the figure) so that a bonding wire 20 and an LED chip 10 can be firmly fixed. Usually this conductive material can be gold, silver, tin, chromium, nickel or the alloy described herein. However, gold is less adopted because of its high price and worse reflection property. The substrate 50c contains a cavity 51c, which is formed from the surface downward to the bottom. The LED chips 10a, 10b and 10c are inlaid into the cavity 51c. A plurality of pads are attached on the outside of the substrate 50c. As shown in the figure, the pads are a first pad 61, a second pad 62, a third pad 63, a fourth pad 64, a fifth pad 65 and a sixth pad 66. The pads are separated and not conductible from each other. A bonding wire 20a couples the LED chip 10a, the first pad 61 and the second pad 62. A bonding wire 20b couples the LED chip 10b, the third pad 63 and the fourth pad 64. A bonding wire 20c couples the LED chip 10c, the fifth pad 65 and the sixth pad 66. A cope 70 is filled in the cavity 51c and covers the LED chips and the aforesaid bonding wires for protecting the LED chips and the bonding wires. The cope 70 can be manufactured by low pressure molding technology or encapsulation technology. At last three LEDs are obtained by dicing the package structure of LEDs of the embodiment. As shown in FIG.7, the light emits from four sides of the LED.

The three embodiments descried above illustrate a thinner structure of the surface mounting LED. Furthermore, the light of the LED emits from the multiple surfaces of the substrate by inlaying the LED chip inside a cavity formed from the surface of the substrate downward to the bottom.

The invention being thus described, will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A package structure of surface mounting light emitting diodes (LEDs)comprising:

a substrate having a cavity and a plurality of pads insulating from each other;

at least one LED chip wholly inlaid in said cavity;

a bonding wire for coupling said LED chips and said plurality of pads; and a cope, filled in said cavity and covering said LED chip and said bonding wire thereby protecting said LED chips and said bonding wire.

2. The package structure of surface mounting light emitting diodes (LEDs) of claim 1, wherein the cavity is formed from the upper surface downward to the bottom of the substrate.

3. The package structure of surface mounting light emitting diodes (LEDs) of claim 2, wherein the substrate is selected from one of the group consisting of metal , non-metal and both.

4. The package structure of surface mounting light emitting diodes (LEDs) of claim 3, wherein the metal substrate is selected from one of the group consisting of metal, non-metal and both.

5. The package structure of surface mounting light emitting diodes (LEDs) of claim 1, wherein the top and bottom layers of the substrate are coated with a conductive material for firmly fixing said wire bonding.

6. The package structure of surface mounting light emitting diodes (LEDs) of claim 5, wherein the conductive material is selected from one of the group consisting of gold, silver, tin, chromium, nickel and the alloy.

7. The package structure of surface mounting light emitting diodes (LEDs) of claim 1, wherein the bonding wire is covered with encapsulation material on the substrate by glob top method.

8. The package structure of surface mounting light emitting diodes (LEDs) of claim 1, wherein the cope is manufactured by molding technology.

9. The package structure of surface mounting light emitting diodes (LEDs) of claim 1, wherein the cope is manufactured by encapsulation technology.

* * * * *